(12) United States Patent
Ogita

(10) Patent No.: US 11,653,146 B2
(45) Date of Patent: May 16, 2023

(54) INFORMATION PROCESSING DEVICE, INFORMATION PROCESSING METHOD, AND PROGRAM

(71) Applicant: SONY CORPORATION, Tokyo (JP)

(72) Inventor: Takeshi Ogita, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 17/251,017

(22) PCT Filed: Jun. 24, 2019

(86) PCT No.: PCT/JP2019/024911
§ 371 (c)(1),
(2) Date: Dec. 10, 2020

(87) PCT Pub. No.: WO2020/008931
PCT Pub. Date: Jan. 9, 2020

(65) Prior Publication Data
US 2021/0219050 A1    Jul. 15, 2021

(30) Foreign Application Priority Data
Jul. 4, 2018 (JP) .............................. JP2018-127718

(51) Int. Cl.
*H04R 3/00* (2006.01)
(52) U.S. Cl.
CPC ........... *H04R 3/00* (2013.01); *H04R 2400/03* (2013.01); *H04R 2430/01* (2013.01)

(58) Field of Classification Search
CPC .. H04R 3/00; H04R 2400/03; H04R 2430/01; H03G 9/02; A63F 13/285
USPC ............................................. 381/62–63, 107
See application file for complete search history.

(56) References Cited

U.S. PATENT DOCUMENTS

| | | | | |
|---|---|---|---|---|
| 9,549,260 | B2* | 1/2017 | Oishi | H04R 5/04 |
| 10,150,029 | B2* | 12/2018 | Yamano | G06F 1/266 |
| 10,347,093 | B2* | 7/2019 | Rihn | G08B 6/00 |
| 10,758,820 | B2* | 9/2020 | Ueda | A63F 13/24 |
| 2011/0286606 | A1* | 11/2011 | Al-Naimi | G10K 11/17827 381/71.1 |
| 2015/0154966 | A1* | 6/2015 | Bharitkar | G10L 19/008 381/23 |
| 2015/0323996 | A1* | 11/2015 | Obana | A63F 13/2145 345/177 |
| 2016/0192067 | A1* | 6/2016 | Obana | A63F 13/533 381/334 |
| 2018/0348879 | A1* | 12/2018 | Kim | G10H 1/0091 |

FOREIGN PATENT DOCUMENTS

| | | |
|---|---|---|
| JP | H03-075694 U | 7/1991 |
| JP | H06-033752 Y | 8/1994 |
| JP | 2001-212508 A | 8/2001 |
| JP | 4467601 B2 | 5/2010 |

* cited by examiner

*Primary Examiner* — Disler Paul
(74) *Attorney, Agent, or Firm* — Paratus Law Group, PLLC

(57) ABSTRACT

An information processing device (100) including a control unit that causes, on a basis of vibration output characteristics of a vibration device (200), the vibration device (200) to output a vibration corresponding to sound data.

16 Claims, 9 Drawing Sheets

[FIG. 1]
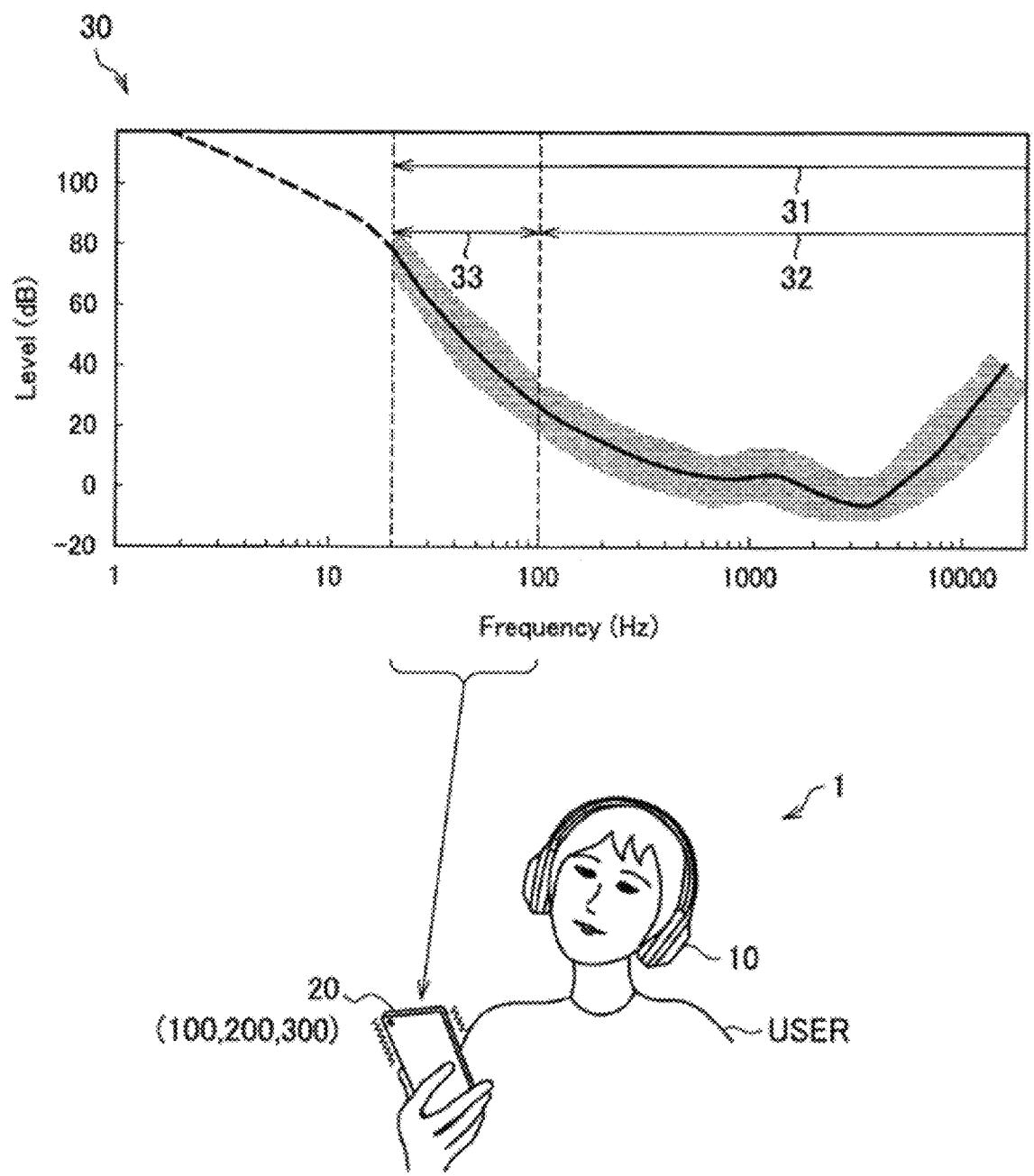

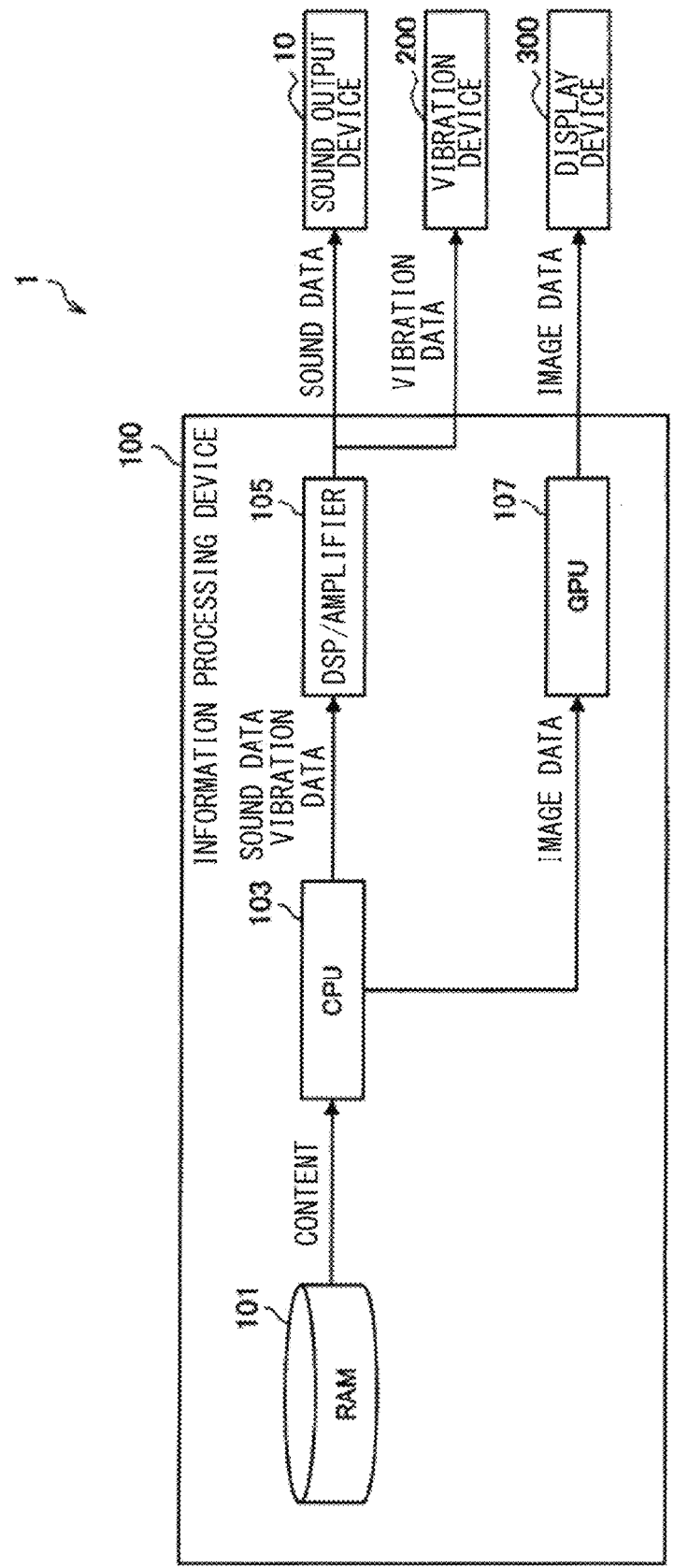
[FIG. 2]

[FIG. 3]
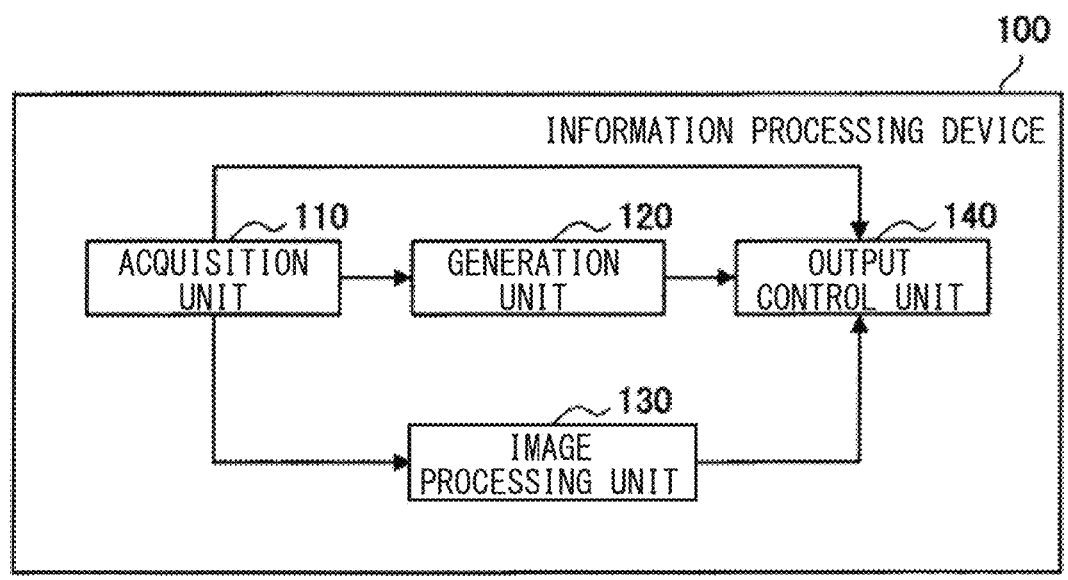

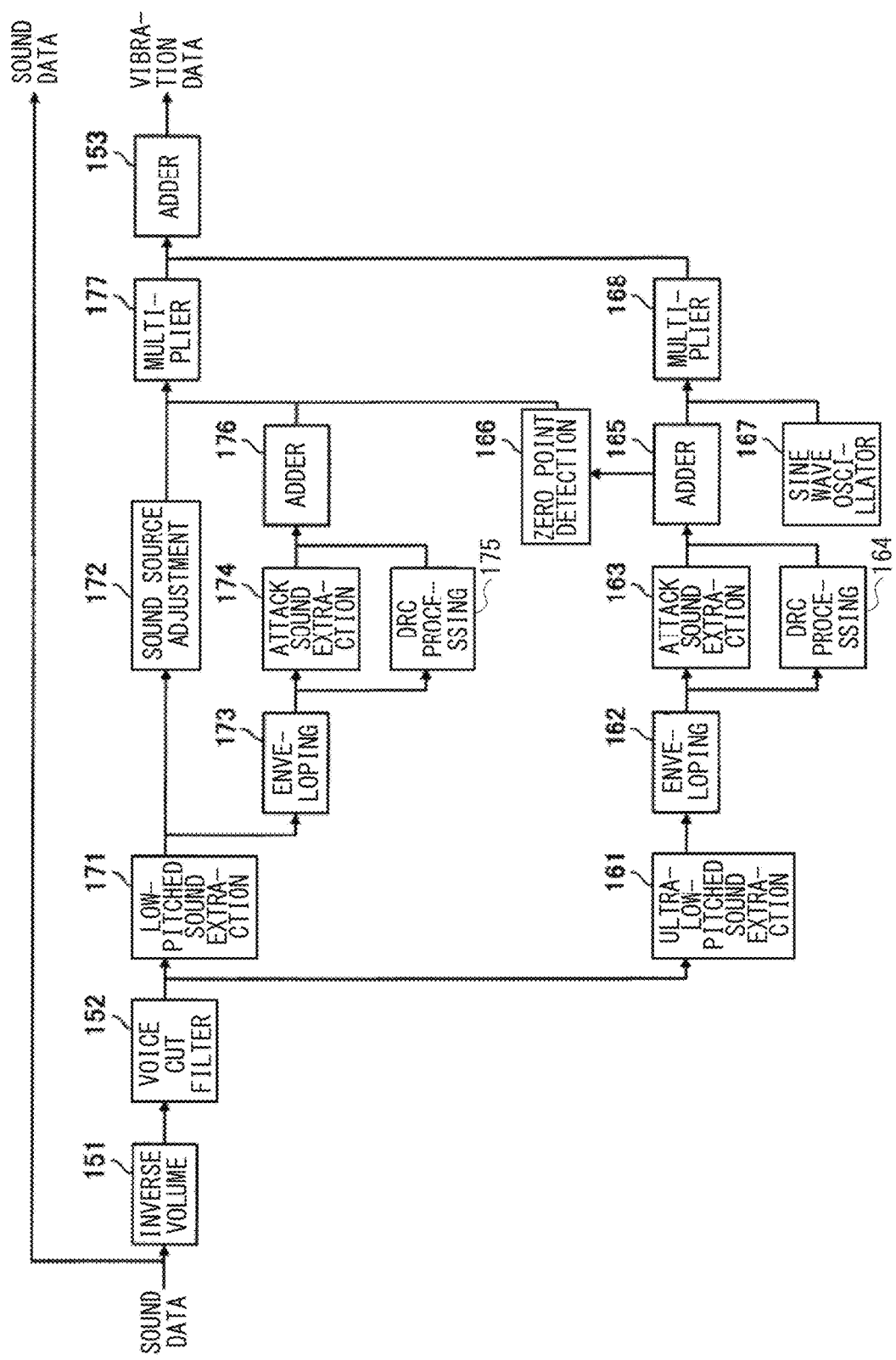
[FIG. 4]

[ FIG. 5 ]
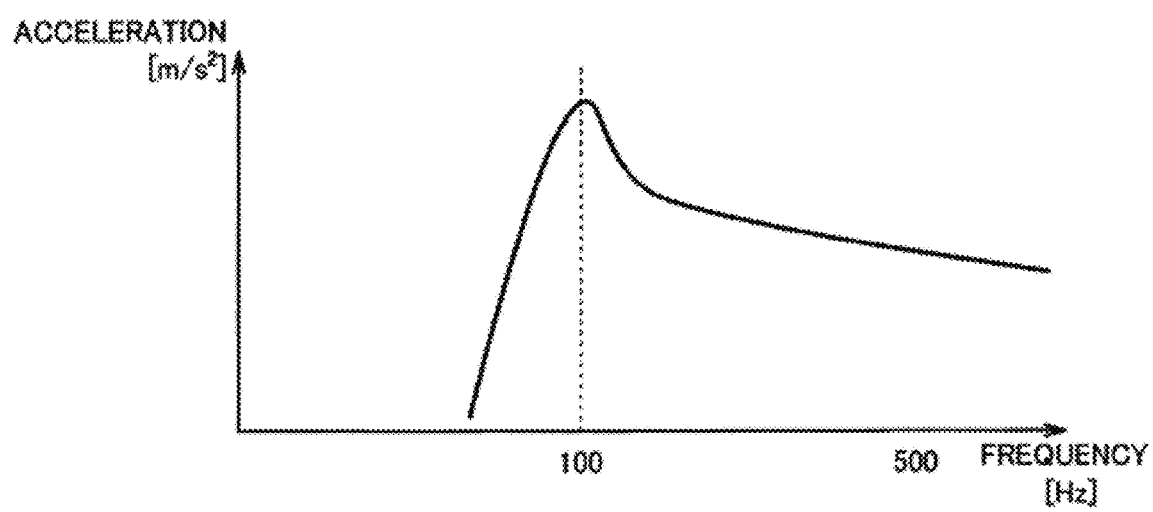

[FIG. 6]
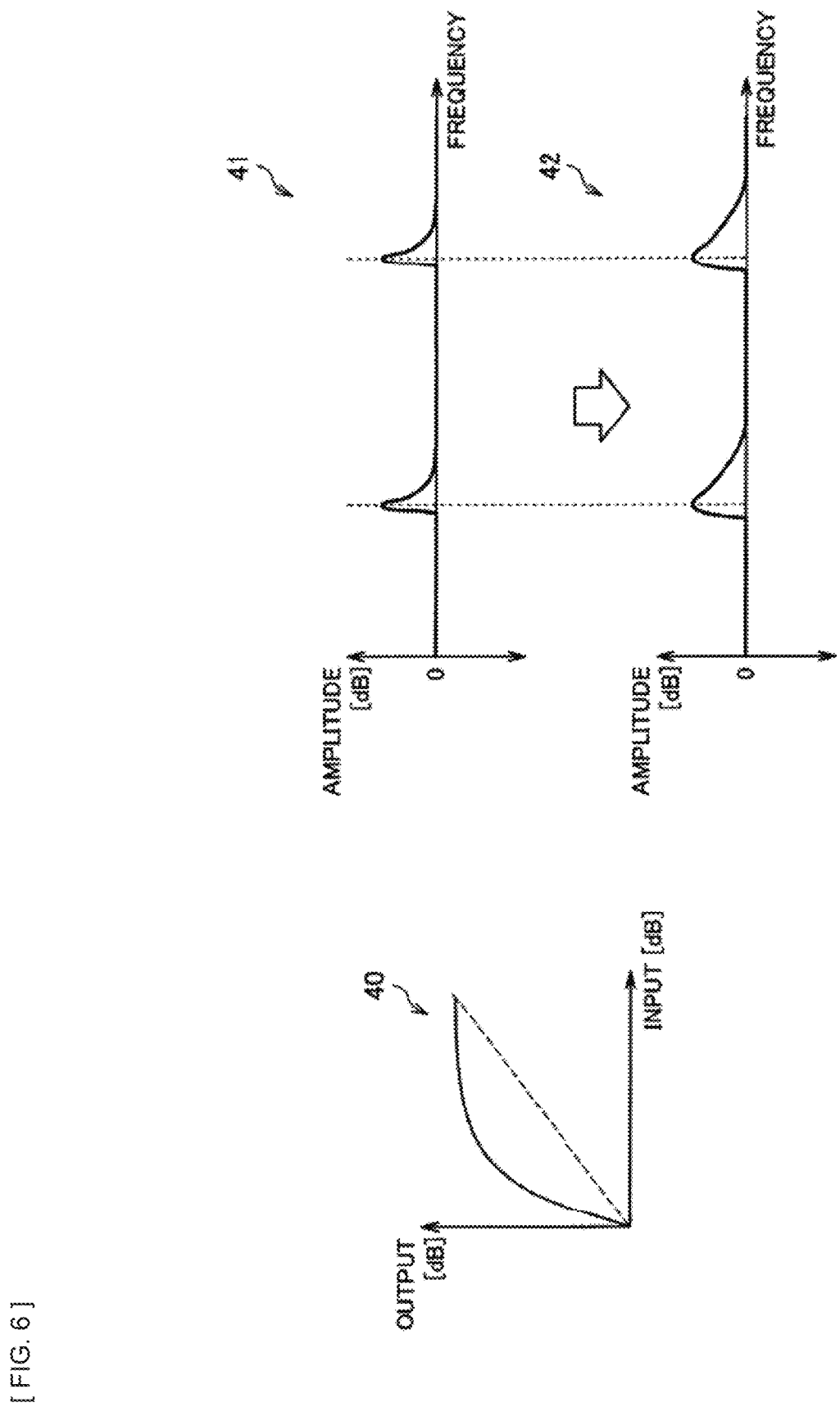

[ FIG. 7 ]
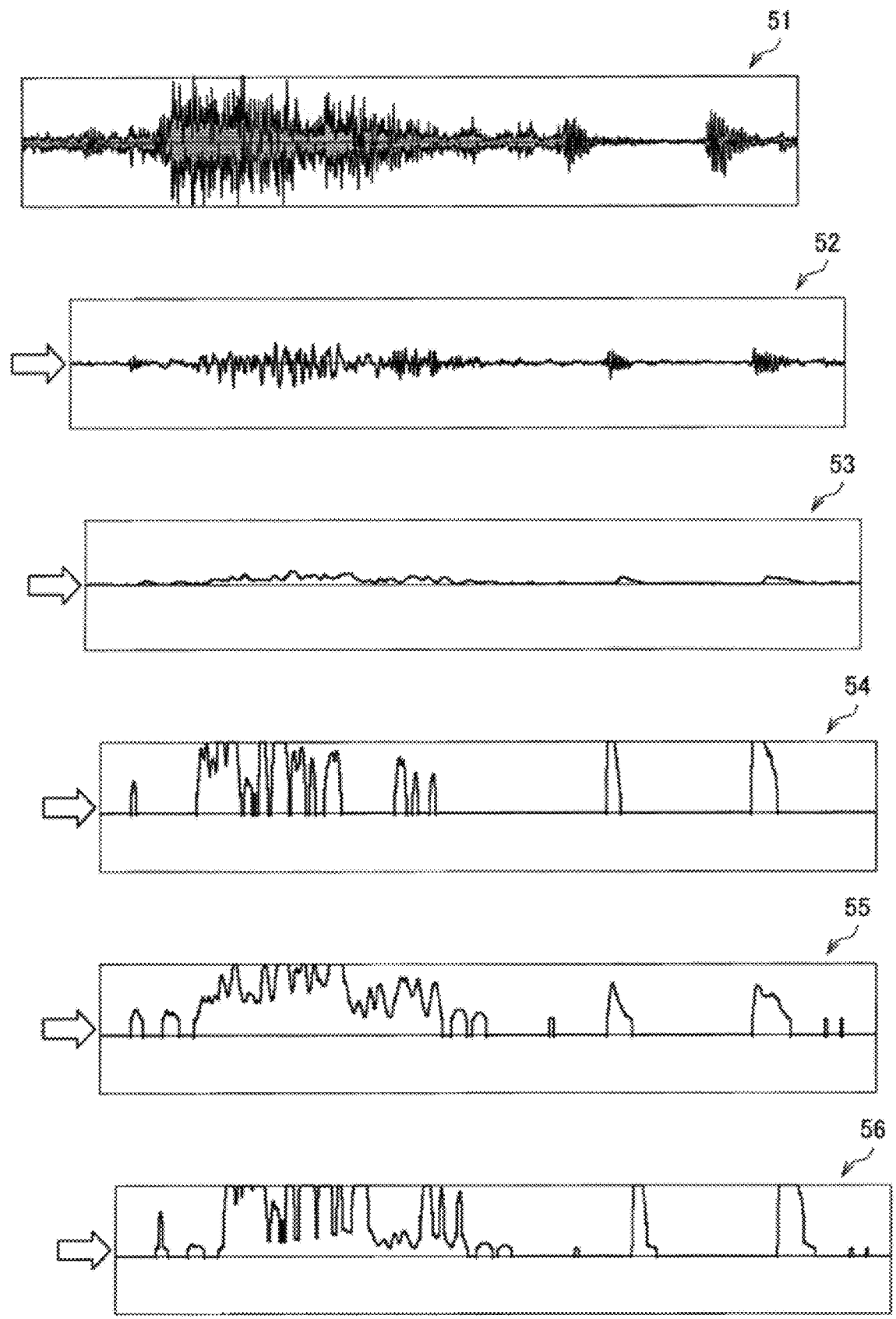

[FIG. 8]

| SOUND OUTPUT DEVICE | | | SETTING EXAMPLE A | SETTING EXAMPLE B | SETTING EXAMPLE C |
|---|---|---|---|---|---|
| | | | HEADPHONE | SPEAKER | HEADPHONE |
| CONTENT | | | MUSIC | MUSIC | MOVIE |
| PROCESSING FOR LOW-PITCHED SOUND PART | LOW-PITCHED SOUND EXTRACTION | | EXTRACT 100 Hz TO 500 Hz | EXTRACT 200 TO 500 Hz | EXTRACT 100 Hz TO 500 Hz |
| | SOUND SOURCE ADJUSTMENT | | MULTIPLY BY THREE TIMES AND OUTPUT | MULTIPLY BY THREE TIMES AND OUTPUT | MULTIPLY BY TWO TIMES AND OUTPUT |
| | ATTACK SOUND EXTRACTION | | EXTRACT AFTER MULTIPLYING INPUT BY SIX TIMES | EXTRACT AFTER MULTIPLYING INPUT BY SIX TIMES | EXTRACT AFTER MULTIPLYING INPUT BY THREE TIMES |
| | DRC PROCESSING | | (curve graph OUTPUT vs INPUT) | (curve graph OUTPUT vs INPUT) | (curve graph OUTPUT vs INPUT) |
| | ADDER | | ADD AT ATTACK SOUND EXTRACTION : DRC PROCESSING = 1:0.8 | ADD AT ATTACK SOUND EXTRACTION : DRC PROCESSING = 1:0.8 | ADD AT ATTACK SOUND EXTRACTION : DRC PROCESSING = 1:1 |
| PROCESSING FOR ULTRA-LOW-PITCHED SOUND PART | ULTRA-LOW-PITCHED SOUND EXTRACTION | | EXTRACT 0 Hz TO 100 Hz | NOT PROCESSED | EXTRACT 0 Hz TO 100 Hz |
| | DRC PROCESSING | | (curve graph OUTPUT vs INPUT) | NOT PROCESSED | (curve graph OUTPUT vs INPUT) |
| | ADDER | | ADD AT ATTACK SOUND EXTRACTION : DRC PROCESSING = 1:0.8 | NOT PROCESSED | ADD AT ATTACK SOUND EXTRACTION : DRC PROCESSING = 1:1 |

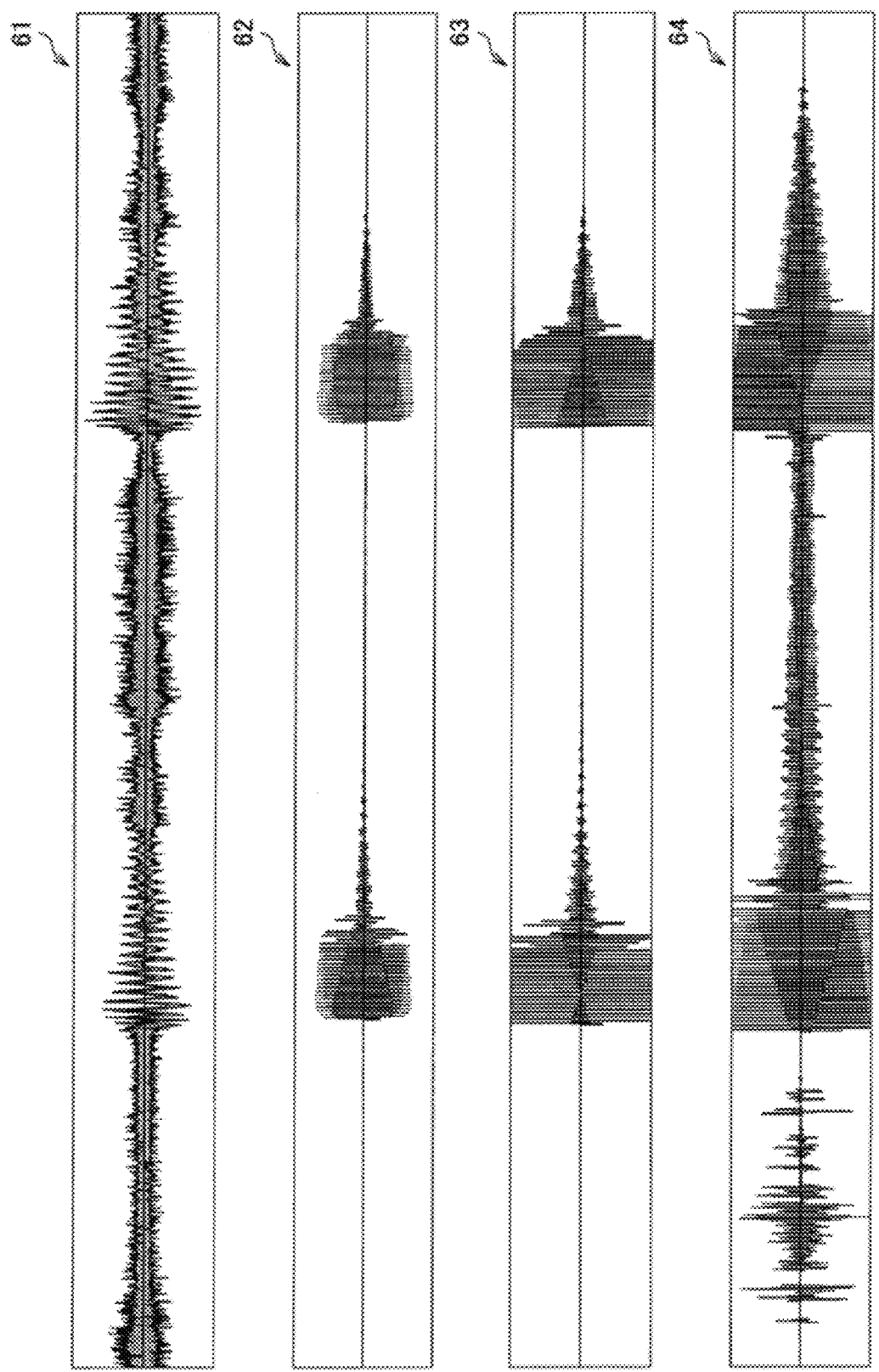
[FIG. 9]

INFORMATION PROCESSING DEVICE, INFORMATION PROCESSING METHOD, AND PROGRAM

CROSS REFERENCE TO PRIOR APPLICATION

This application is a National Stage Patent Application of PCT International Patent Application No. PCT/JP2019/024911 (filed on Jun. 24, 2019) under 35 U.S.C. § 371, which claims priority to Japanese Patent Application No. 2018-127718 (filed on Jul. 4, 2018), which are all hereby incorporated by reference in their entirety.

TECHNICAL FIELD

The present disclosure relates to an information processing device, an information processing method, and a program.

BACKGROUND ART

A variety of techniques for presenting tactile stimulation such as a vibration to a user have been proposed. For example, PTL 1 listed below discloses a technique of outputting, along with voice output based on a voice signal, a low-frequency region of the voice signal as a vibration to thereby emphasize beats and thus to improve realistic sensation.

CITATION LIST

Patent Literature

PTL 1: Japanese Patent No. 4467601

SUMMARY OF THE INVENTION

Problems to be Solved by the Invention

However, the technique disclosed in the above-listed PTL 1 merely allows for extracting beats on the basis of a voice signal and outputting the extracted beats simply as a vibration. Considering that characteristics of a vibration to be outputted may be different depending on characteristics of vibration devices that output the vibration, it can be said that there is still a room for improvement in the technique disclosed in the above-listed PTL 1.

Therefore, the present disclosure provides a mechanism that makes it possible to further improve a user experience involving vibration presentation.

Means for Solving the Problems

According to the present disclosure, there is provided an information processing device including a control unit that causes, on the basis of vibration output characteristics of a vibration device, the vibration device to output a vibration corresponding to sound data.

Further, according to the present disclosure, there is provided an information processing method performed by a processor, in which the method includes causing, on the basis of vibration output characteristics of a vibration device, the vibration device to output a vibration corresponding to sound data.

Further, according to the present disclosure, there is provided a program that causes a computer to function as a control unit that causes, on the basis of vibration output characteristics of a vibration device, the vibration device to output a vibration corresponding to sound data.

Effects of the Invention

As described above, the present disclosure provides a mechanism that makes it possible to further improve a user experience involving vibration presentation. It is to be noted that the above-mentioned effects are not necessarily limitative; in addition to or in place of the above effects, there may be achieved any of the effects described in the present specification or other effects that may be grasped from the present specification.

BRIEF DESCRIPTION OF DRAWING

FIG. 1 is a diagram of assistance in explaining overview of a content delivery system according to an embodiment of the present disclosure.

FIG. 2 is a block diagram illustrating an example of a hardware configuration of an information processing device according to the present embodiment.

FIG. 3 is a block diagram illustrating an example of a functional configuration of the information processing device according to the present embodiment.

FIG. 4 is a block diagram illustrating an example of a processing flow of signal processing to be executed by the information processing device according to the present embodiment.

FIG. 5 is a graph illustrating an example of frequency-acceleration characteristics of a vibration device according to the present embodiment.

FIG. 6 is a diagram of assistance in explaining an example of DRC processing to be executed by the information processing device according to the present embodiment.

FIG. 7 illustrates examples of a waveform formed by the signal processing by the information processing device according to the present embodiment.

FIG. 8 illustrates setting examples of processing parameters of the information processing device according to the present embodiment.

FIG. 9 illustrates examples of vibration data generated by the information processing device according to the present embodiment.

MODES FOR CARRYING OUT THE INVENTION

Hereinafter, description is given in detail of preferred embodiments of the present disclosure with reference to the accompanying drawings. It is to be noted that, in the present specification and drawings, repeated description is omitted for components substantially having the same functional configuration by assigning the same reference numerals.

It is to be noted that description is given in the following order.
1. Overview
2. Configuration Example
   2.1. Hardware Configuration Example
   2.2. Functional Configuration Example
3. Signal Processing
4. Parameter Setting
5. Conclusion

1. OVERVIEW

First, referring to FIG. 1, description is made of overview of a content delivery system according to an embodiment of the present disclosure.

FIG. 1 is a diagram of assistance in explaining overview of a content delivery system 1 according to the present embodiment. In the example illustrated in FIG. 1, the content delivery system 1 includes a sound output device 10 and a terminal device 20.

The sound output device 10 is a device that outputs sound. In the example illustrated in FIG. 1, the sound output device 10 is a headphone. Alternatively, the sound output device 10 may be implemented as an earphone, a speaker, or the like. The sound output device 10, which is coupled to the terminal device 20 by wire or wireless, outputs sound on the basis of data received from the terminal device 20.

The terminal device 20 is a device that controls an output of a content. In the example illustrated in FIG. 1 FIG. 1, the terminal device 20 is a smartphone. Alternatively, the terminal device 20 may be implemented as a PC (Personal Computer), a tablet termina, or the like. In addition, the content is data including at least sound data such as music or a movie. The content may also include image (moving image/still image) data in addition to the sound data.

The terminal device 20 has functions as an information processing device 100, a vibration device 200, and a display device 300. FIG. 1 illustrates an example where the information processing device 100, the vibration device 200, and the display device 300 are integrated as the terminal device 20; however, the devices may be configured as independent devices. Description is made below of each of the devices.

The vibration device 200 is a device that presents a vibration to a vibration presentation target. Examples of the vibration presentation target include any object such as a person, an animal, or a robot. In the example illustrated in FIG. 1, the vibration presentation target is a user, and the description is made below with the assumption that the vibration presentation target is a user. The vibration device 200 presents a vibration to a user who is in contact with the vibration device 200. In the example illustrated in FIG. 1, the vibration device 200 presents a vibration to a hand of the user who holds the terminal device 20. The vibration device 200, which is coupled to the information processing device 100 by wire or wireless, outputs a vibration on the basis of data received from the information processing device 100.

The display device 300 is a device that outputs an image (moving image/still image). The display device 300 is implemented as, for example, a CRT display device, a liquid crystal display device, a plasma display device, an EL display device, a laser projector, an LED projector, a lamp, or the like. The display device 300, which is coupled to the information processing device 100 by wire or wireless, outputs an image on the basis of data received from the information processing device 100.

The information processing device 100 is a device that controls the whole of the content delivery system 1. The information processing device 100 causes the sound output device 10, the vibration device 200, and the display device 300 to cooperate with one another to output a content. For example, while causing the display device 300 to display an image, the information processing device 100 causes the sound output device 10 to output sound synchronized with the image and causes the vibration device 200 to output a vibration synchronized with the sound. For example, the information processing device 100 causes a low-pitched sound part (i.e., a low-frequency sound) to be outputted as a vibration, thereby making it possible to reinforce the low-pitched sound part, which is difficult to hear, by virtue of bodily sensation to improve a user experience.

A frequency audible to human ears is usually said to be about 20 Hz to 20,000 Hz. In addition, sensitivity characteristics (i.e., audibility) of a human ear differ depending on frequency. For example, a low-frequency sound, sensitivity to which is low, is less likely to be recognized as sound. A graph 30 is a graph illustrating an example of characteristics of a sound to be outputted from the sound output device 10, in which a horizontal axis represents frequency and a vertical axis represents sound pressure level. Out of an audio frequency band 31, which is usually said to be 20 Hz to 20,000 Hz, as one example, sensitivity to a sound in a frequency band 32 of 100 Hz or more is high, while sensitivity to a sound in a frequency band 33 of less than 100 Hz is low. In this case, it is desirable that sound in the frequency band 33 be outputted as a vibration from the vibration device 200. This causes the user to mistakenly recognize feeling the vibration by hand as hearing a low-pitched sound, thus enabling the user to enjoy the content with high realistic sensation.

However, characteristics of a sound to be outputted (hereinafter, also referred to as sound output characteristics) may differ depending on the sound output device 10. For example, a headphone is relatively more likely to output a low-pitched sound part, whereas an earphone is relatively less likely to output a low-pitched sound part. Likewise, characteristics of a vibration to be outputted (hereinafter, also referred to as vibration output characteristics) may differ depending on the vibration device 200. For example, a frequency more likely to cause a vibration and a frequency less likely to cause a vibration may be different depending on the vibration device 200.

In a case where the content is outputted without consideration of these output characteristics, the user experience may be deteriorated. For example, in a case where a lower limit of a frequency able to be outputted by the sound output device 10 is 500 Hz, the output of a vibration of 100 Hz or less from the vibration device 200 increases a frequency difference between the sound and the vibration. In this case, the user is less likely to mistakenly recognize the vibration felt by hand as a low-pitched sound, eventually perceiving the sound and the vibration as independent stimuli. As a result, rather than the low-pitched sound part being reinforced by bodily sensation, a vibration that seems to be irrelevant is provided, thus deteriorating the user experience.

In view of such circumstances, the information processing device 100 according to the present embodiment has been proposed. The information processing device 100 according to the present embodiment causes the vibration device 200 to output a vibration corresponding to sound data in accordance with the output characteristics of an output device involving providing the content. Examples of the output characteristics of the output device involving providing the content include the sound output characteristics and/or the vibration output characteristics. This makes it possible to prevent the above-described deterioration of the user experience and thus to further improve the user experience.

The description has been made hereinabove of the overview of the content delivery system 1 according to the present embodiment. Description is made below of the detail of the content delivery system 1.

2. CONFIGURATION EXAMPLE

2.1. Hardware Configuration Example

Referring to FIG. 2, description is made below of a hardware configuration example of the information processing device 100. FIG. 2 is a block diagram illustrating an example of a hardware configuration of the information processing device 100 according to the present embodiment. As illustrated in FIG. 2, the information processing device 100 includes a RAM (Random Access Memory) 101, a CPU (Central Processing Unit) 103, a DSP/amplifier 105, and a GPU (Graphics Processing Unit) 107.

The RAM 101 is an example of a storage unit that stores information. The RAM 101 stores data of content and outputs the data to the CPU 103. Such functions as the storage unit may be implemented by a magnetic storage device such as an HDD, a semiconductor storage device, an optical storage device, a magneto-optical storage device, or the like instead of or in addition to the RAM 101.

The CPU 103 is an example of a control unit that functions as an arithmetic processing device and a control device and controls all the operations in the information processing device 100 in accordance with various programs. The CPU 103 processes the data of the content outputted from the RAM 101, and outputs sound data and vibration data to the DSP/amplifier 105 and image data to the GPU 107. At that time, the CPU 103 performs control to cause the vibration device 200 to output a vibration corresponding to the sound data on the basis of the sound output characteristics of the sound output device 10 and/or the vibration output characteristics of the vibration device 200. Such a function as the control unit may be implemented by an electric circuit, a DSP, an ASIC, or the like instead of or in addition to the CPU 103. It is to be noted that the vibration data contains at least information indicating the characteristics such as amplitude and a frequency of a vibration to be outputted from the vibration device 200. The vibration data may be a drive signal for driving the vibration device 200.

The DSP/amplifier 105 has a function of applying predetermined processing to a signal to amplify the signal. The DSP/amplifier 105 amplifies a signal outputted from the CPU 103 and outputs the amplified signal to a corresponding output device. For example, the DSP/amplifier 105 amplifies the sound data (for example, sound signal) and outputs the amplified sound data to the sound output device 10. The sound output device 10 outputs a sound on the basis of the sound signal outputted from the DSP/amplifier 105. Further, the DSP/amplifier 105 amplifies the vibration data (for example, drive signal) and outputs the amplified vibration data to the vibration device 200. The vibration device 200 is driven on the basis of the vibration data outputted from the DSP/amplifier 105 to thereby output a vibration. It is to be noted that at least a portion of the signal processing to be performed by the CPU 103 may be executed by the DSP/amplifier 105.

The GPU 107, which functions as an image processing unit, performs processing such as drawing of an image to be displayed by the display device 300. The GPU 107 processes the image data outputted from the CPU 103 and outputs the processed image data to the display device 300. The display device 300 performs display on the basis of the image data outputted from the GPU 107.

2.2. Functional Configuration Example

Subsequently, referring to FIG. 3, description is made of a functional configuration example of the information processing device 100. FIG. 3 is a block diagram illustrating an example of a functional configuration of the information processing device 100 according to the present embodiment. As illustrated in FIG. 3, the information processing device 100 includes an acquisition unit 110, a generation unit 120, an image processing unit 130, and an output control unit 140. It is to be noted that the acquisition unit 110, the generation unit 120, and the output control unit 140 may be implemented by the CPU 103 and/or the DSP/amplifier 105 and that the image processing unit 130 may be implemented by the GPU 107.

The acquisition unit 110 has a function of acquiring the data of the content. The acquisition unit 110 may acquire the data of the content from the storage unit built in the information processing device 100, such as the RAM 101, or may acquire the data of the content from an external device through a communication path by wire or wireless. The acquisition unit 110 outputs the sound data, of the acquired data of the content, to the generation unit 120 and the output control unit 140 and the image data to the image processing unit 130.

The generation unit 120 has a function of generating vibration data on the basis of the sound data of the content. For example, the generation unit 120 applies predetermined processing to the sound data to thereby convert the sound data into the vibration data. The generation unit 120 generates the vibration data from the sound data on the basis of the sound output characteristics of the sound output device 10 and/or the vibration output characteristics of the vibration device 200. The generation unit 120 then outputs the generated vibration data to the output control unit 140.

The image processing unit 130 has a function of performing the processing such as drawing of an image to be outputted by the display device 300 on the basis of the image data of the content. The image processing unit 130 outputs the processed image data to the output control unit 140.

The output control unit 140 has a function of controlling output of information by various output devices. The output control unit 140 causes the sound output device 10 to output sound based on the sound data outputted from the acquisition unit 110. The output control unit 140 causes the vibration device 200 to output a vibration based on the vibration data outputted from the generation unit 120. The output control unit 140 causes the display device 300 to output the image based on the image data outputted from the image processing unit 130.

3. SIGNAL PROCESSING

Referring to FIG. 4, description is made below of an example of signal processing by the information processing device 100. FIG. 4 is a block diagram illustrating an example of a processing flow of the signal processing to be executed by the information processing device 100 according to the present embodiment. As illustrated in FIG. 4, the sound data is also used for generation of the vibration data while being treated as sound data as it is. Description is made below mainly of the generation of the vibration data.

(Preprocessing)

Inverse Volume Processing 151

As illustrated in FIG. 4, the generation unit 120 first applies inverse volume processing 151 to the sound data. The inverse volume processing is processing to apply an inverse volume setting of a volume setting having been applied to the sound data. Examples of the volume setting applied to the sound data include settings of increase/reduction in a volume as a whole and increase/reduction in a volume per frequency band, which may be set by a user or the sound output device 10. The generation unit 120 performs, referring to the volume setting, amplitude control for resetting a volume of the sound data to an original volume, such as reducing an increased volume or increasing a reduced volume. The inverse volume processing may include processing to normalize the volume.

Voice Cut Filter 152

Next, the generation unit 120 applies a voice cut filter 152 to the sound data to which the inverse volume processing 151 has been applied. The voice cut filter 152 is a filter that removes a frequency band corresponding to a human voice from the sound data. While outputting a human voice as a vibration often makes the user feel uncomfortable, such a filter is able to reduce the uncomfortable feeling.

After the preprocessing, the generation unit 120 generates the vibration data for causing the vibration device 200 to vibrate on the basis of a first frequency. The first frequency is a frequency that determines an upper limit of a signal to which processing for an ultra-low-pitched sound is to be applied (also referred to as a first partial signal). The first frequency is also a frequency that determines a lower limit of a frequency of a signal to which processing for a low-pitched sound part is to be applied (also referred to as a second partial signal). Further, the generation unit 120 generates the vibration data for causing the vibration device 200 to vibrate on the basis of a second frequency. The second frequency is a frequency that determines an upper limit of the frequency of the second partial signal. The generation unit 120 applies different signal processing to each of the first partial signal and the second partial signal. In the following, a detailed description is made of the processing for an ultra-low-pitched sound part to be applied to the first partial signal and the processing for a low-pitched sound part to be applied to the second partial signal.

(Processing for Ultra-Low-Pitched Sound Part)

Ultra-Low-Pitched Sound Extracting Process 161

The generation unit 120 applies an ultra-low-pitched sound extraction processing 161 to the sound data to which the voice cut filter 152 has been applied. The ultra-low-pitched sound extraction processing 161 is processing to extract the first partial signal, which is a signal of the ultra-low-pitched sound part among the sound data. In particular, the generation unit 120 extracts the first partial signal which is a signal with the first frequency or less from the sound data.

The first frequency is a frequency corresponding to the vibration output characteristics of the vibration device 200. For example, the first frequency is a frequency corresponding to a resonance frequency (or resonance point) of the vibration device 200 (a frequency identical to or close to the resonance frequency). The vibration output characteristics of the vibration device 200 refer to, for example, a concept representing the characteristics of the vibration to be outputted by the vibration device 200, which include frequency-acceleration characteristics, a resonance frequency, an upper limit/lower limit of a frequency able to be outputted, magnitude of a vibration able to be outputted, a response speed, and the like. FIG. 5 illustrates an example of the vibration output characteristics of the vibration device 200. FIG. 5 is a graph illustrating an example of the frequency-acceleration characteristics of the vibration device 200 according to the present embodiment. A horizontal axis in this graph represents a frequency, and a vertical axis represents acceleration. Typically, the vibration device 200 is less likely to output a vibration with a frequency equal to or less than the resonance frequency. Further, at a frequency equal to or less than the resonance frequency (the lower limit of the frequency able to be outputted), no vibration is outputted. The example illustrated in FIG. 5 demonstrates that the resonance frequency of the vibration device 200 is 100 Hz, and acceleration (i.e., vibration) is less likely to be given at a frequency equal to or less than 100 Hz. Accordingly, a dedicated processing for an ultra-low-pitched sound part is applied to sound data with the resonance frequency or less, which is less likely to vibrate, thereby making it possible to generate vibration data matching the vibration output characteristics. It is to be noted that in a case of where there is a plurality of resonance frequencies, the first frequency is a frequency corresponding to the lowest resonance frequency.

Enveloping Processing 162

The generation unit 120 applies enveloping processing 162 to the first partial signal extracted through the ultra-low-pitched sound extraction processing 161. The enveloping processing 162 is processing to take out an envelope of an amplitude of the sound data. Applying the enveloping processing 162 prevents saturation (saturation) of the vibration data in an amplitude direction.

Attack Sound Extraction Processing 163

The generation unit 120 applies attack sound extraction processing 163 to the first partial signal to which the enveloping processing 162 has been applied. The attack sound extraction processing 163 is processing to extract an attack sound. The attack sound is a sound at rise. The attack sound corresponds to, for example, a beat tapping a rhythm.

For the attack sound extraction processing 163, processing similar to beat extraction processing disclosed in the above-listed PTL 1 may be used. To briefly explain, the generation unit 120 calculates a spectrum of the inputted sound data at each time, and calculates a time differential value of the spectrum per unit time. The generation unit 120 then compares a peak value of a waveform of the time differential value of the spectrum with a predetermined threshold value, thus extracting a waveform with a peak exceeding the threshold value as an attack sound component. The extracted attack sound component contains information regarding a timing of the attack sound and an intensity of the attack sound at that time. The generation unit 120 then applies the enveloping to the extracted attack sound component, thus generating and outputting a waveform that rises at the timing of the attack sound and attenuates at a rate slower than a rate of rise.

DRC (Dynamic Range Control) Processing 164

The generation unit 120 applies DRC processing 164 to the first partial signal to which the enveloping processing 162 has been applied. The DRC processing 164 is processing to control an amplitude to allow a predetermined relationship to be established between an amplitude of an input signal and an amplitude of an output signal. Typically, a lingering sound component with sound drop emphasized is generated through the DRC processing 164. Description is made of an example of the DRC processing 164 with reference to FIG. 6.

FIG. 6 is a diagram of assistance in explaining an example of the DRC processing 164 to be executed by the information processing device 100 according to the present embodiment. A graph 40 of FIG. 6 illustrates an example of the relationship between the amplitude of the input signal and the amplitude of the output signal in the DRC processing 164, in which a horizontal axis represents the amplitude of the input signal and a vertical axis represents the amplitude of the output signal. According to the graph 40, the input signal and the output signal are coincident with each other in the minimum value and the maximum value of the amplitude, and the amplitude of the output signal is larger than the amplitude of the input signal between the minimum value and the maximum value. In a case where such DRC processing 164 is applied, for example, an input signal 41 is converted into an output signal 42. When comparing the input signal 41 and the output signal 42 with each other, it is found that drop of the output signal 42 is gentler, and takes longer time to reach zero after reaching a peak. As described above, the application of the DRC processing 164 increases a sound drop duration, thus emphasizing a lingering sound.

Adder 165

An adder 165 synthesizes (for example, adds) the first partial signal to which the attack sound extraction processing 163 has been applied and the first partial signal to which the DRC processing 164 has been applied. That is, the adder 165 adds the extracted attack sound component and the lingering sound component. This makes it possible to add the lingering sound to the attack sound. It is to be noted that the adder 165 may add the signals with weighting being applied.

It is to be noted that the enveloping processing 162, the attack sound extraction processing 163, the DRC processing 164, and the addition by the adder 165 to be applied to the first partial signal are also referred to as first processing.

Zero Point Detection Processing 166

The generation unit 120 applies zero point detection processing 166 to the first partial signal to which the addition by the adder 165 has been applied. The zero point detection processing 166 is processing to detect a timing when the amplitude of the inputted signal falls below a predetermined threshold value or less. The predetermined threshold value is typically zero, but may be a positive number other than zero. The zero point detection processing 166 outputs, as a detection result, a predetermined positive number other than zero (for example, one) during a period of the predetermined threshold value or less, and outputs zero in a case where the predetermined threshold value is exceeded. For example, the zero point detection processing 166 outputs one in a case where the amplitude of the inputted signal is zero, and outputs zero in a case where the amplitude of the inputted signal exceeds zero. The detection result of the zero point detection processing 166 is used in the later-described processing for a low-pitched sound part.

Sine Wave Oscillator 167

A sine wave oscillator 167 oscillates a sine wave with a predetermined frequency. The sine wave oscillator 167 oscillates a sine wave with a frequency corresponding to the vibration output characteristics of the vibration device 200. For example, the sine wave oscillator 167 oscillates a sine wave with the first frequency.

Multiplier 168

A multiplier 168 multiplies a result of having applied the first processing to the first partial signal and the sine wave with the first frequency oscillated by the sine wave oscillator 167. As described above regarding the ultra-low-pitched sound extraction processing 161, the vibration device 200 is less likely to vibrate at a frequency equal to or less than the first frequency. In this regard, the multiplication by the multiplier 168 makes it possible to express the ultra-low-pitched sound part, which is less likely to vibrate, at the first frequency in a pseudo manner.

(Processing for Low-Pitched Sound Part)

Low-Pitched Sound Extraction Processing 171

The generation unit 120 applies low-pitched sound extraction processing 171 to the sound data to which the voice cut filter 152 has been applied. The low-pitched sound extraction processing 171 is processing to extract a signal of the low-pitched sound part (hereinafter, also referred to as the second partial signal) among the sound data. In particular, the generation unit 120 extracts the second partial signal, which is a signal exceeding the first frequency but not exceeding the second frequency, from the sound data. The second frequency is a frequency greater than the first frequency. The second frequency may be set optionally. However, it is desirable that the second frequency be a frequency corresponding to the sensitivity characteristics of a human ear and the sound output characteristics of the sound output device 10.

For example, it is desirable that the second frequency be a frequency higher than a lower limit of a human audio frequency band. In other words, it is desirable that the second partial signal be generated from sound data containing the human audio frequency band. The lower limit of the human audio frequency band is, for example, 20 Hz. This causes a user audible frequency band among the sound to be outputted from the sound output device 10 on the basis of the sound data to overlap a frequency band of the vibration to be outputted on the basis of the low-pitched sound part of the sound data. Therefore, the sound and the vibration are prevented from being perceived as independent stimuli, thus making it possible to prevent the deterioration of the user experience.

Further, it is desirable that the second frequency be a frequency higher than a lower limit of a frequency band able to be outputted by the sound output device 10. In other words, it is desirable that the second partial signal be generated from sound data containing the frequency band able to be outputted by the sound output device 10. This causes a sound frequency band to be outputted from the sound output device 10 to overlap a vibration frequency band to be outputted from the vibration device 200. Therefore, the sound and the vibration are prevented from being perceived as independent stimuli, thus making it possible to prevent the deterioration of the user experience.

Sound Source Adjustment Processing 172

The generation unit 120 applies sound source adjustment processing 172 to the second partial signal extracted through the low-pitched sound extraction processing 171. The sound source adjustment processing 172 performs, for example, processing to amplify the amplitude of the inputted signal. An amplification factor is any real number. It is to be noted that the amplification may not be performed in the sound source adjustment processing 172.

Enveloping Processing 173

The generation unit 120 applies enveloping processing 173 to the second partial signal extracted through the low-pitched sound extraction processing 171. Processing contents of the enveloping processing 173 are similar to those of the enveloping processing 162.

Attack Sound Extraction Processing 174

The generation unit 120 applies attack sound extraction processing 174 to the second partial signal to which the enveloping processing 173 has been applied. Processing contents of the attack sound extraction processing 174 are similar to those of the attack sound extraction processing 163.

DRC Processing 175

The generation unit 120 applies DRC processing 175 to the second partial signal to which the enveloping processing 173 has been applied. Processing contents of the DRC processing 175 are similar to those of the DRC processing 164.

Adder 176

An adder 176 adds the second partial signal to which the attack sound extraction processing 174 has been applied and the second partial signal to which the DRC processing 175 has been applied. Processing contents of the adder 176 are similar to those of the adder 165.

It is to be noted that the enveloping processing 173, the attack sound extraction processing 174, the DRC processing 175, and the addition by the adder 176 to be applied to the second partial signal are also referred to as second processing. Here, in the example illustrated in FIG. 4, the first processing to be applied to the first partial signal and the second processing to be applied to the second partial signal are the same in the types of processing included therein; however, the present technology is not limited to such an example. For example, the first processing and the second processing may each include different processing. Further, the first processing and the second processing may be different in parameters in the same processing. For example, the attack sound extraction processing 163 and the attack sound extraction processing 174 may be different in the threshold value in extracting the attack sound component.

Multiplier 177

A multiplier 177 multiplies a result of having applied the second processing to the second partial signal and the second partial signal amplified by the sound source adjustment processing 172. Further, the multiplier 177 multiplies the detection result of the zero point detection processing 166.

(Synthesis Processing)

Adder 153

An adder 153 synthesizes (for example, adds) the first partial signal to which the processing for an ultra-low-pitched sound part has been applied and the second partial signal to which the processing for a low-pitched sound part has been applied, thereby generating the vibration data. Here, the second partial signal has been multiplied by the detection result of the zero point detection processing 166. For this reason, the adder 153 synthesizes the first partial signal to which the processing for an ultra-low-pitched sound part has been applied, and a signal, out of the second partial signal to which the processing for a low-pitched sound part has been applied, during a period when the amplitude of the first partial signal to which the processing for an ultra-low-pitched sound part has been applied is equal to or less than the predetermined threshold value. For example, the adder 153 synthesizes the first partial signal to which the processing for an ultra-low-pitched sound part has been applied, and a signal, out of the second partial signal to which the processing for a low-pitched sound part has been applied, during a period when the amplitude of the first partial signal to which the processing for an ultra-low-pitched sound part has been applied is zero. This prevents the vibration data from saturating in the amplitude direction as a result of the synthesis. It is to be noted that the adder 153 may add the signals with weighting being applied.

The vibration data is generated from the sound data through the processing described above.

(Examples of Waveform)

FIG. 7 illustrates examples of a waveform to be formed through the signal processing by the information processing device 100 according to the present embodiment. A horizontal axis of each of waveforms illustrated in FIG. 7 represents time, and a vertical axis, a middle of which is zero, represents amplitude. A waveform 51 is an example of a waveform of the sound data to be inputted to the generation unit 120. A waveform 52 is an example of a waveform of the second partial signal extracted through the low-pitched sound extraction processing 171. A waveform 53 is an example of a waveform of the second partial signal to which the enveloping processing 173 has been applied. A waveform 54 is an example of a waveform of the attack sound component extracted through the attack sound extraction processing 174. A waveform 55 is an example of a waveform of the lingering sound component extracted through the DRC processing 175. A waveform 56 is an example of a waveform of the second partial signal to which the attack sound component and the lingering sound component are added by the adder 176.

4. PARAMETER SETTING

The generation unit 120 outputs the vibration corresponding to the sound data to the vibration device 200 on the basis of a variety of information. Further, the generation unit 120 variably sets processing parameters for the generation of the vibration data on the basis of a variety of information. For example, the generation unit 120 variably sets parameters of the various types of processing described above with reference to FIG. 4. This makes it possible to present an optimal vibration to the user without the necessity for the user to manually set the parameters. In the following, description is made of an example of setting criteria for the parameter setting.

Example of Setting Criteria

The generation unit 120 causes the vibration device 200 to output the vibration corresponding to the sound data on the basis of the vibration output characteristics of the vibration device 200. That is, the generation unit 120 sets the processing parameters on the basis of the vibration output characteristics of the vibration device 200. For example, the generation unit 120 sets the first frequency on the basis of the resonance frequency of the vibration device 200. Further, the generation unit 120 may set the processing parameters on the basis of whether or not the vibration device 200 (or the terminal device 20 including the vibration device 200) is foldable, or opened or closed in a case of being foldable, as well as on the basis of a temperature of the vibration device 200. One reason for this is that these may change the vibration output characteristics. Such settings based on the vibration output characteristics enable the vibration device 200 to output a suitable vibration according to the characteristics of the vibration device 200.

The generation unit 120 may cause the vibration device 200 to output the vibration corresponding to the sound data on the basis of the sound output characteristics of the sound output device 10. That is, the generation unit 120 may set the processing parameters on the basis of the sound output characteristics of the sound output device 10. For example, the generation unit 120 sets the second frequency on the basis of the sound output characteristics. Specifically, the generation unit 120 sets the second frequency at a frequency higher than the lower limit of the frequency band able to be outputted by the sound output device 10. In addition, the generation unit 120 may set the processing parameters on the basis of a volume able to be outputted or a frequency able to be outputted by the sound output device 10, etc. Such settings enable the vibration device 200 to output a suitable vibration according to the sound output characteristics of the sound output device 10.

The generation unit 120 may cause the vibration device 200 to output the vibration corresponding to the sound data on the basis of the characteristics of the sound data. That is, the generation unit 120 may set the processing parameters on the basis of the characteristics of the sound data. Examples of the characteristics of the sound data include attributes of contents including the sound data, such as whether the sound data is sound data of a movie, sound data of music, sound data of a game, or sound data of news. For example, the generation unit 120 sets a parameter for extraction of the attack sound component and a parameter for extraction of the lingering sound component in accordance with these attributes of the contents. In addition, the examples of the characteristics of the sound data include a volume. For example, the generation unit 120 performs the processing to reset volume adjustment by the user through the inverse volume processing 151. Such settings enable the vibration device 200 to output a suitable vibration according to the characteristics of the sound data.

The generation unit 120 may cause the vibration device 200 to output the vibration corresponding to the sound data on the basis of characteristics of a user who receives the vibration to be delivered by the vibration device 200. That is, the generation unit 120 may set the processing parameters on the basis of the characteristics of the user who receives the vibration to be delivered by the vibration device 200. For example, the generation unit 120 sets the processing parameters to cause a strong vibration to be outputted to a user who is likely to perceive a vibration or a user who is used to a vibration, while causing a weak vibration to be outputted to a user who is not. Examples of the characteristics of the user include attributes of the user such as age and sex. In addition, the examples of the attributes of the user include a liking for contents such as frequency of watching a drama, frequency of listening to music, and frequency of playing a game. Such settings enable the vibration device 200 to output a suitable vibration according to the characteristics of the user.

The generation unit 120 may cause the vibration device 200 to output the vibration corresponding to the sound data on the basis of a state of use of the vibration device 200 by a user who receives the vibration to be delivered by the vibration device 200. That is, the generation unit 120 may set the processing parameters on the basis of the state of use of the vibration device 200 by the user who receives the vibration to be delivered by the vibration device 200. Examples of the state of use include a length of a duration of use of the vibration device 200, time of use of the vibration device 200, and a motion of the user during the use of the vibration device 200. For example, the user gets more used to a vibration with an increase in the duration of use of the vibration device 200, and thus the generation unit 120 sets the processing parameters to cause a strong vibration to be outputted. For example, in a case where the time of use of the vibration device 200 is night, the generation unit 120 sets the processing parameters to cause a weak vibration to be outputted. For example, in a case where the user uses the vibration device 200 while walking or riding in a train, the generation unit 120 sets the processing parameters to cause a strong vibration to be outputted because of difficulty in perception of a vibration. In contrast, in a case where the user uses the vibration device 200 while being seated, the generation unit 120 sets the processing parameters to cause a weak vibration to be outputted because of easiness in perception of a vibration. Such settings enable the vibration device 200 to output a suitable vibration according to the state of use of the vibration device 200.

Specific Examples of Parameter Setting

In the following, description is made of specific setting examples of the processing parameters with reference to FIG. 8.

FIG. 8 illustrates the setting examples of the processing parameters of the information processing device 100 according to the present embodiment. FIG. 8 illustrates, as examples, setting examples A to C. The setting example A is a setting example in a case where the sound output device 10 is a headphone and the content is music. The setting example B is a setting example in a case where the sound output device 10 is a speaker and the content is music. The setting example C is a setting example in a case where the sound output device 10 is a headphone and the content is a movie.

First, description is made of the setting example A. In the low-pitched sound extraction processing 171, a signal of 100 Hz to 500 Hz is extracted as the second partial signal. In the sound source adjustment processing 172, the input signal is amplified by three times. In the attack sound extraction processing 174, the attack sound component is extracted after the input signal is amplified by six times. In the DRC processing 175, as illustrated, processing for an input/output relationship having a relatively large input/output difference is applied. In the adder 176, an output from the attack sound extraction processing 174 and an output from the DRC processing 175 are added with weighting being applied at 1:0.8. Further, in the ultra-low-pitched sound extraction processing 161, a signal of 0 Hz to 100 Hz is extracted as the first partial signal. In the attack sound extraction processing 163, the attack sound component is extracted after the input signal is amplified by six times. In the DRC processing 164, as illustrated, the processing for the input/output relationship having a relatively large input/output difference is applied. In the adder 165, an output from the attack sound extraction processing 163 and an output from the DRC processing 164 are added with weighting being applied at 1:0.8.

Next, description is made of the setting example B. In the low-pitched sound extraction processing 171, a signal of 200 Hz to 500 Hz is extracted as the second partial signal. In the sound source adjustment processing 172, the input signal is amplified by three times. In the attack sound extraction processing 174, the attack sound component is extracted after the input signal is amplified by six times. In the DRC processing 175, as illustrated, the processing for the input/output relationship having a relatively large input/output difference is applied. In the adder 176, an output from the attack sound extraction processing 174 and an output from the DRC processing 175 are added with weighting being applied at 1:0.8. Further, the processing for an ultra-low-pitched sound part is not executed.

Next, description is made of the setting example C. In the low-pitched sound extraction processing 171, a signal of 100 Hz to 500 Hz is extracted as the second partial signal. In the sound source adjustment processing 172, the input signal is amplified by two times. In the attack sound extraction processing 174, the attack sound component is extracted after the input signal is amplified by three times. In the DRC processing 175, as illustrated, processing for an input/output relationship having a relatively small input/output difference is applied. In the adder 176, an output from the attack sound extraction processing 174 and an output from the DRC processing 175 are added with weighting being applied at 1:1. Further, in the ultra-low-pitched sound extraction processing 161, a signal of 0 Hz to 100 Hz is extracted as the first partial signal. In the attack sound extraction processing 163, the attack sound component is extracted after the input signal is amplified by three times. In the DRC processing 164, as illustrated, the processing for the input/output relationship having a relatively small input/output difference is applied. In the adder 165, an output from the attack sound extraction processing 163 and an output from the DRC processing 164 are added with weighting being applied at 1:1.

Specific Examples of Waveform Corresponding to Parameter Setting

In the following, description is made of specific examples of a waveform corresponding to the parameter setting with reference to FIG. 9.

FIG. 9 illustrates examples of vibration data to be generated by the information processing device 100 according to the present embodiment. A waveform 61 illustrated in FIG. 9 is an example of a waveform of sound data to be inputted to the generation unit 120, and waveform 62 to waveform 64 are examples of waveforms of the vibration data to be generated from the sound data indicated by the waveform 61. The waveform 62 is a waveform in a case where the sound output device 10 is an earphone, which has sound output characteristics of being less likely to output a low-pitched sound, the vibration device 200 has vibration output characteristics of not being able to output a vibration of 50 Hz or less, and the content is a movie. The waveform 63 is a waveform in a case where the sound output device 10 is a headphone, which has sound output characteristics of being likely to output a low-pitched sound, the vibration device 200 has vibration output characteristics of not being able to output a vibration of 50 Hz or less, and the content is a game. The waveform 64 is a waveform in a case where the sound output device 10 is a headphone, which has sound output characteristics of being likely to output a low-pitched sound, the vibration device 200 has vibration output characteristics of not being able to output a vibration of 50 Hz or less, and the content is music.

5. CONCLUSION

The detailed description has been made hereinabove of an embodiment of the present disclosure with reference to FIG. 1 to FIG. 9. As described above, the information processing device 100 according to the present embodiment causes the vibration device 200 to output the vibration corresponding to the sound data on the basis of the vibration output characteristics of the vibration device 200. With the vibration output characteristics taken into consideration in causing the vibration device 200 to output the vibration corresponding to the sound data, the information processing device 100 prevents, for example, separation between the frequency of the sound to be outputted and the frequency of the vibration to be outputted, thus making it possible to prevent the deterioration of the user experience. Further, the low-pitched sound part, which is difficult to hear, is reinforced more reliably by bodily sensation of the vibration, thus making it possible to improve the user experience.

Although the description has been given above in detail of preferred embodiments of the present disclosure with reference to the accompanying drawings, the technical scope of the present disclosure is not limited to such examples. It is obvious that a person having ordinary skill in the art of the present disclosure may find various alterations or modifications within the scope of the technical idea described in the claims, and it should be understood that these alterations and modifications naturally come under the technical scope of the present disclosure.

It is to be noted that the devices described herein may be implemented as a single device or a part or all thereof may be implemented as separate devices. For example, out of the functional configuration example of the information processing device 100 illustrated in FIG. 3, the generation unit 120 may be provided in a device such as a server coupled to the acquisition unit 110, the image processing unit 130, and the output control unit 140 through a network or the like. Further, for example, at least two of the information processing device 100, the vibration device 200, the display device 300, and the sound output device 10 illustrated in FIG. 2 may be implemented as one device. For example, as illustrated in FIG. 1, the information processing device 100, the vibration device 200, and the display device 300 may be implemented as the terminal device 20.

Further, a series of processing by each device described herein may be implemented using any of software, hardware, and a combination of software and hardware. A program included in the software is stored in advance, for example, in a storage medium (non-transitory medium: non-transitory media) provided inside or outside each device. Then, each program is read by RAM, for example, when executed by a computer, and is executed by a processor such as CPU. Examples of the above-described storage medium include a magnetic disk, an optical disk, a magneto-optical disk, and a flash memory. Alternatively, the above-described computer programs may be distributed through, for example, a network instead of using the storage medium.

Further, the processing described herein using the processing flow illustrated in FIG. 4 is not necessarily performed in the illustrated order. Some of the processing steps may be executed in parallel. Further, an additional processing step may be adopted, and a portion of the processing steps may be omitted.

In addition, the effects described herein are merely illustrative or exemplary, and are not limitative. That is, the technology according to the present disclosure may achieve, in addition to or in place of the above effects, other effects that are obvious to those skilled in the art from the description of the present specification.

It is to be noted that the technical scope of the present disclosure also includes the following configurations.

(1)

An information processing device including a control unit that causes, on a basis of vibration output characteristics of a vibration device, the vibration device to output a vibration corresponding to sound data.

(2)

The information processing device according to (1), in which the control unit generates, on a basis of a first frequency corresponding to the vibration output characteristics, vibration data for causing the vibration device to vibrate.

(3)

The information processing device according to (2), in which the control unit generates the vibration data by extracting a first partial signal from the sound data, extracting a second partial signal from the sound data, and applying different signal processing to each of the first partial signal and the second partial signal to be synthesized, the first partial signal being a signal with the first frequency or less, the second partial signal being a signal exceeding the first frequency but not exceeding a second frequency.

(4)

The information processing device according to (3), in which the control unit synthesizes the first partial signal to which the signal processing is applied, and a signal, out of the second partial signal to which the signal processing is applied, during a period when an amplitude of the first partial signal to which the signal processing is applied is equal to or less than a predetermined threshold value.

(5)

The information processing device according to (3) or (4), in which the signal processing includes multiplying a result of application of first processing to the first partial signal and a sine wave of the first frequency.

(6)

The information processing device according to (5), in which the signal processing includes multiplying a result of application of second processing to the second partial signal and a signal resulting from amplifying the second partial signal.

(7) The information processing device according to (6), in which the first processing and the second processing each include enveloping processing.

(8) The information processing device according to (6) or (7), in which the first processing and the second processing each include extraction of an attack sound, application of DRC processing, and synthesis of an extraction result of the attack sound and a result of the DRC processing.

(9) The information processing device according to any one of (3) to (8), in which the control unit applies, to the sound data, an inverse volume setting of a volume setting applied to the sound data.

(10) The information processing device according to any one of (3) to (9), in which the first frequency includes a frequency corresponding to a resonance frequency of the vibration device.

(11) The information processing device according to any one of (3) to (10), in which the second frequency includes a frequency higher than a lower limit of a human audio frequency band.

(12) The information processing device according to any one of (3) to (11), in which the second frequency includes a frequency higher than a lower limit of a frequency band able to be outputted by a sound output device that outputs a sound on a basis of the sound data.

(13) The information processing device according to any one of (3) to (12), in which the control unit causes the vibration device to output the vibration corresponding to the sound data on a basis of sound output characteristics of the sound output device that outputs a sound on a basis of the sound data.

The information processing device according to any one of (3) to (13), in which the control unit causes the vibration device to output the vibration corresponding to the sound data on a basis of characteristics of the sound data.

(15) The information processing device according to any one of (3) to (14), in which the control unit causes the vibration device to output the vibration corresponding to the sound data on a basis of characteristics of a user who receives the vibration delivered by the vibration device.

(16) The information processing device according to any one of (3) to (15), in which the control unit causes the vibration device to output the vibration corresponding to the sound data on a basis of a state of use of the vibration device by the user who receives the vibration delivered by the vibration device.

(17) An information processing method executed by a processor, the method including causing, on a basis of vibration output characteristics of a vibration device, the vibration device to output a vibration corresponding to sound data.

(18) A program that causes a computer to function as a control unit that causes, on a basis of vibration output characteristics of a vibration device, the vibration device to output a vibration corresponding to sound data.

REFERENCE NUMERALS LIST 1 content delivery system
10 sound output device
20 terminal device
100 information processing device
101 RAM
103 CPU
105 DSP/amplifier
107 GPU
110 acquisition unit
120 generation unit
130 image processing unit
140 output control unit
200 vibration device
300 display device

The invention claimed is:

1. An information processing device comprising:
a control unit configured to cause, based on vibration output characteristics of a vibration device and sound output characteristics of a sound output device, the vibration device to output a vibration corresponding to sound data used to cause the sound output device to output a sound,
wherein the control unit is further configured to generate vibration data for causing the vibration device to vibrate,
wherein the control unit generates the vibration data by extracting a plurality of partial signals from the sound data and applying signal processing to the plurality of partial signals,
wherein the control unit generates the vibration data based on a first frequency corresponding to the vibration output characteristics,
wherein the control unit generates the vibration data by extracting a first partial signal from the sound data,
extracting a second partial signal from the sound data,
applying first signal processing to the first partial signal, and
applying second signal processing to the second partial signal,
wherein the first partial signal is a signal with the first frequency or less,
wherein the second partial signal is a signal exceeding the first frequency but not exceeding a second frequency,
wherein the first signal processing includes multiplying a result of application of first processing to the first partial signal and a sine wave of the first frequency, and
wherein the control unit is implemented via at least one processor.

2. The information processing device according to claim 1,
wherein the control unit is further configured to synthesize
the first partial signal to which the first signal processing is applied, and
a signal, out of the second partial signal to which the second signal processing is applied, during a period when an amplitude of the first partial signal to which the first signal processing is applied is equal to or less than a predetermined threshold value.

3. The information processing device according to claim 1,
wherein the second signal processing includes multiplying a result of application of second processing to the second partial signal and a signal resulting from amplifying the second partial signal.

4. The information processing device according to claim 3,
wherein the first processing and the second processing each include enveloping processing.

5. The information processing device according to claim 3,
wherein the first processing and the second processing each include extraction of an attack sound, application of DRC processing, and synthesis of an extraction result of the attack sound and a result of the DRC processing.

6. The information processing device according to claim 1,
wherein the control unit is further configured to apply, to the sound data, an inverse volume setting of a volume setting applied to the sound data.

7. The information processing device according to claim 1,
wherein the first frequency comprises a frequency corresponding to a resonance frequency of the vibration device.

8. The information processing device according to claim 1,
wherein the second frequency comprises a frequency higher than a lower limit of a human audio frequency band.

9. The information processing device according to claim 1,
wherein the second frequency comprises a frequency higher than a lower limit of a frequency band able to be outputted by the sound output device configured to output the sound based on the sound data.

10. The information processing device according to claim 1,
wherein the control unit causes the vibration device to output the vibration corresponding to the sound data based on sound output characteristics of the sound output device configured to output the sound based on the sound data.

11. The information processing device according to claim 1,
wherein the control unit causes the vibration device to output the vibration corresponding to the sound data based on characteristics of the sound data.

12. The information processing device according to claim 1,
wherein the control unit causes the vibration device to output the vibration corresponding to the sound data based on characteristics of a user who receives the vibration delivered by the vibration device.

13. The information processing device according to claim 1,
wherein the control unit causes the vibration device to output the vibration corresponding to the sound data based on a state of use of the vibration device by a user who receives the vibration delivered by the vibration device.

14. The information processing device according to claim 1,
wherein the first signal processing and the second signal processing include different types of signal processing.

15. An information processing method executed by a processor, the method comprising:
causing, based on vibration output characteristics of a vibration device and sound output characteristics of a sound output device, the vibration device to output a vibration corresponding to sound data used to cause the sound output device to output a sound; and
generating vibration data for causing the vibration device to vibrate,
wherein the vibration data is generated by extracting a plurality of partial signals from the sound data and applying signal processing to the plurality of partial signals;
wherein the vibration data is generated based on a first frequency corresponding to the vibration output characteristics,
wherein the vibration data is generated by
extracting a first partial signal from the sound data,
extracting a second partial signal from the sound data,
applying first signal processing to the first partial signal, and
applying second signal processing to the second partial signal,
wherein the first partial signal is a signal with the first frequency or less,
wherein the second partial signal is a signal exceeding the first frequency but not exceeding a second frequency, and
wherein the first signal processing includes multiplying a result of application of first processing to the first partial signal and a sine wave of the first frequency.

16. A non-transitory computer-readable storage medium having embodied thereon a program, which when executed by a computer causes the computer to execute a method, the method comprising:
causing, based on vibration output characteristics of a vibration device and sound output characteristics of a sound output device, the vibration device to output a vibration corresponding to sound data used to cause the sound output device to output a sound; and
generating vibration data for causing the vibration device to vibrate,
wherein the vibration data is generated by extracting a plurality of partial signals from the sound data and applying signal processing to the plurality of partial signals;
wherein the vibration data is generated based on a first frequency corresponding to the vibration output characteristics,
wherein the vibration data is generated by
extracting a first partial signal from the sound data,
extracting a second partial signal from the sound data,
applying first signal processing to the first partial signal, and
applying second signal processing to the second partial signal,
wherein the first partial signal is a signal with the first frequency or less,
wherein the second partial signal is a signal exceeding the first frequency but not exceeding a second frequency, and
wherein the first signal processing includes multiplying a result of application of first processing to the first partial signal and a sine wave of the first frequency.

* * * * *